Figure 1:
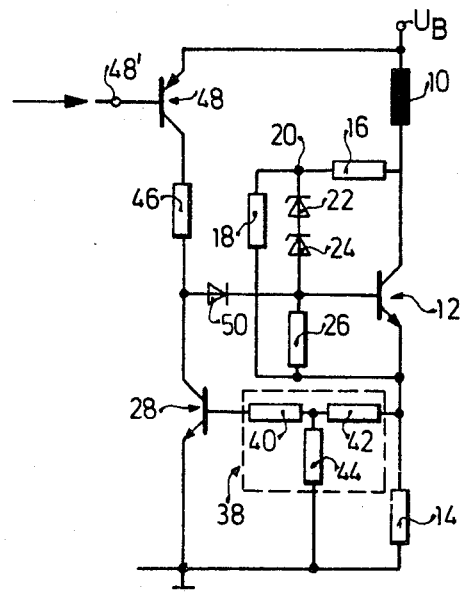

United States Patent [19]

Werner et al.

[11] 4,244,344
[45] Jan. 13, 1981

[54] IGNITION SYSTEM WITH OVERVOLTAGE AND EXCESS CURRENT PROTECTION

[75] Inventors: Peter Werner, Wiernsheim/Iptingen; Werner Jundt, Ludwigsburg; Herman Roozenbeek, Schwieberdingen; Bernd Bodig, Leinfelden, all of Fed. Rep. of Germany

[73] Assignee: Robert Bosch GmbH, Stuttgart, Fed. Rep. of Germany

[21] Appl. No.: 40,070

[22] Filed: May 17, 1979

[30] Foreign Application Priority Data

May 31, 1978 [DE] Fed. Rep. of Germany ....... 2823788

[51] Int. Cl.³ .......................... F02P 1/00; H05B 41/36
[52] U.S. Cl. ................................... 123/650; 123/644; 315/209 T
[58] Field of Search ............ 123/148 E, 148 R, 148 S, 123/117 R; 315/209 T, 209 M

[56] References Cited

U.S. PATENT DOCUMENTS

| | | |
|---|---|---|
| 3,605,713 | 9/1971 | Masters et al. .................... 123/148 E |
| 4,020,816 | 5/1977 | Chateau ............................ 123/148 E |
| 4,088,107 | 5/1978 | Chateau ............................ 123/148 E |
| 4,122,814 | 10/1978 | Ford .................................. 123/148 E |
| 4,128,091 | 12/1978 | Balan et al. ....................... 123/148 E |
| 4,130,101 | 12/1978 | Jundt et al. ....................... 123/148 E |

FOREIGN PATENT DOCUMENTS 2549586  5/1977  Fed. Rep. of Germany .

Primary Examiner—P. S. Lall
Attorney, Agent, or Firm—Frishauf, Holtz, Goodman & Woodward

[57] ABSTRACT

In a known ignition system, the emitter-collector circuit of the ignition transistor is connected in series with the primary winding of the ignition coil and with a precision resistor. When the voltage across the latter exceeds a predetermined value, an auxiliary transistor is switched to a conductive state. The emitter-collector circuit of the auxiliary transistor is connected to the base of the ignition transistor and, when conductive, prevents further increases of current through the primary winding of the ignition coil. To protect this circuit, a series circuit including two Zener diodes is connected between the base and collector of the ignition transistor. Further, a voltage divider is connected in parallel with the emitter-collector circuit of the ignition transistor and an additional resistor is connected between the base and the emitter thereof. When overvoltages across the primary winding cause breakdown of the Zener diodes, the current through the Zener diodes is blocked from the emitter-collector circuit of the auxiliary transistor either by a diode or by a blocking transistor having an emitter-collector circuit connected in parallel with the base-emitter circuit of the auxiliary transistor. The blocking transistor is maintained in the conductive state blocking the auxiliary transistor throughout the application time of an externally applied blocking signal which is adapted to maintain the ignition transistor in the blocked state.

8 Claims, 2 Drawing Figures

IGNITION SYSTEM WITH OVERVOLTAGE AND EXCESS CURRENT PROTECTION

CROSS REFERENCE TO RELATED APPLICATIONS AND PUBLICATIONS:

DE-OS No. 25 49 586

The present invention relates to ignition systems for internal combustions, and, in particular, to ignition systems wherein the ignition transistor has an emitter-collector circuit connected in series to the primary winding of the ignition coil and a current limiting resistor is connected in series with the emitter-collector circuit of the ignition transistor. The so-formed series connection is connected to a source of DC voltage. More particularly, the present invention relates to an ignition system wherein an auxiliary control transistor is provided which becomes conductive when the current through the current limiting resistor reaches a predetermined current value and which, when conductive, controls the ignition transistor to prevent further increases of current through the primary winding of the ignition coil.

BACKGROUND AND PRIOR ART:

The present invention relates to an ignition system as disclosed, for example, in DE-OS No. 25 49 586. This type of circuit operates satisfactorily, but it would be desirable to provide some protection for the ignition transistor against overvoltages while it is in the blocked state, that is while a spark is being generated. Such a protection could comprise a clamping circuit which allows a switching of the ignition transistor to the conductive state for a short time while the spark is being generated, so that dangerous overvoltages would be substantially decreased. This is, however, difficult to accomplish in the known circuit since the current limiting resistor would then immediately cause the auxiliary transistor to become conductive causing the current flowing through the clamping circuit to flow through the emitter-collector circuit of the auxiliary transistor. Under these conditions, a collector-base clamping circuit for the ignition transistor would no longer be effective and the auxiliary transistor could be destroyed by excessive currents.

THE INVENTION

It is an object of the present invention to furnish protective circuits which not only protect the ignition transistor from overvoltages but also protect the auxiliary transistor from excessive currents which could result during operation of the overvoltage protective circuit.

In accordance with the present invention, a clamping circuit is connected between the output circuit and the control electrode of an ignition control element (ignition transistor). The clamping circuit includes at least one threshold element (e.g. a Zener diode) adapted to switch from a blocked to a conductive state when the voltage across the primary winding of the ignition coil exceeds a predetermined voltage. The clamping circuit furnishes a control signal allowing a selected current to flow through the primary winding in response to a voltage across the primary winding exceeding a predetermined voltage. Further, a blocking circuit (e.g. a diode or a transistor) is provided for blocking current flowing through said threshold element when said threshold element is in the conductive state from said output circuit of said auxiliary control element. In a first preferred embodiment, a diode is connected between the emitter-collector circuit of the auxiliary transistor and the clamping circuit with a polarity so as to block any current flowing through the clamping circuit from the emitter-collector circuit of the auxiliary transistor.

In a second preferred embodiment, a blocking transistor has an emitter-collector circuit connected from the base of the auxiliary control resistor to a reference potential. This transistor is maintained in the conductive state thereby blocking the auxiliary control transistor throughout the whole time that an ignition signal adapted to switch the ignition transistor to the blocked state and maintain it in said block state is applied to the ignition system.

Figure 2:
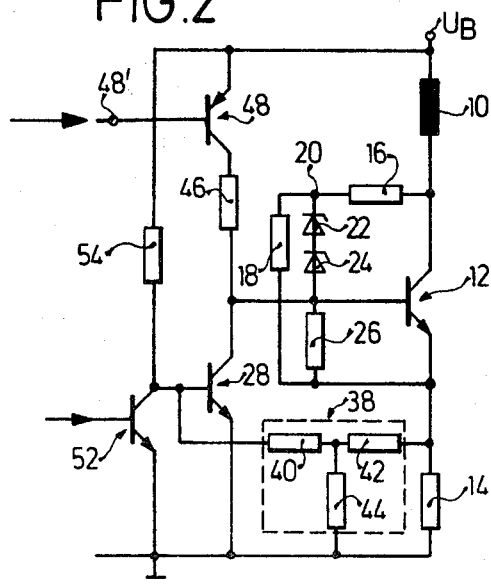

DRAWINGS ILLUSTRATING PREFERRED EMBODIMENTS:

FIG. 1 is a circuit diagram of a first embodiment of part of an ignition system including overvoltage and excess current protection circuits; and FIG. 2 is a second preferred embodiment utilizing a different type of excess current protection. In the ignition system shown in FIG. 1, the primary winding 10 of an ignition coil has a first end connected to the positive terminal of the battery ($U_B$) and a second end connected to the collector of an ignition transistor 12. The emitter of ignition transistor 12 is connected through a precision resistor 14 to a reference potential (e.g. chassis). To protect ignition transistor 12 against overvoltages, it would be possible to connect a single Zener diode with a correspondingly high threshold voltage in parallel with the collector-base circuit of ignition transistor 12. However, in the circuit shown in FIGS. 1 and 2, a voltage divider including resistors 16 and 18 is connected in parallel with the emitter-collector circuit of transistor 12. The common point of resistors 16 and 18 is designated by reference numeral 20 and is connected to the base of transistor 12 by a series circuit including two Zener diodes 22, 24. An additional resistor 26 is connected between the base of transistor 12 and its emitter. The base of an auxiliary transistor 28 is connected through a voltage divider including resistors 40, 42 and 44 to the terminal of precision resistor 14 which is connected to the emitter of transistor 12. The voltage divider 38 is theoretically not required, but is generally used in practice. The emitter of auxiliary transistor 28 is connected to the reference potential, while its collector is connected through a load resistor 46 and the emitter-collector circuit of an input transistor 48 to battery terminal $U_B$.

In the known ignition system, transistor 12 is the output stage of a more or less complicated control circuit as, for example, described in the above-mentioned DE-OS No. 25 49 586. As indicated by an arrow in FIGS. 1 and 2, an ignition signal, adapted to maintain transistor 12 in the blocked state throughout its duration, is applied to the base of transistor 48 at a terminal 48' by the remainder of the ignition system (not illustrated).

A current blocking diode is connected between the collector of transistor 28 and the base of transistor 12.

OPERATION:

In the absence of the ignition signal at terminal 48', transistor 12 is in the conductive state. A current flows from the battery $U_B$ through the primary winding 10 of the ignition coil, the collector-emitter circuit of transistor 12 and precision resistor 14 to the reference potential. Because of the inductance of the ignition coil, the current in the series circuit of primary winding of the ignition coil, emitter-collector circuit of transistor 12 and precision resistor 14 increases in accordance with a predetermined exponential function. This increases the voltage across resistor 14. As soon as this voltage has reached a predetermined voltage corresponding to a predetermined current through primary winding 10, auxiliary transistor 28 is switched to the conductive state. This causes a decrease in the conductivity of the emitter-collector circuit of transistor 12 so that further increases of current through the primary winding 10 beyond the predetermined maximum current value do not occur. This current limited condition, which in modern transistorized ignition systems is kept to as short a time period as possible, is maintained until the externally applied ignition signal is applied at terminal 48'. This causes transistor 12 to block which, in known fashion, results in a steep increase in voltage across primary winding 10 and therefore across the secondary winding of the ignition coil. A spark plug in the secondary winding then creates a spark due to the high voltage across it.

Let it now be assumed that, for any reason, the voltage across primary winding 10 increases beyond a predetermined value while transistor 12 is blocked, thereby creating the danger that the reverse voltage of transistor 12 is exceeded causing transistor 12 to be destroyed. Under these conditions, Zener diodes 22 and 24 break down, causing a voltage to be applied to the base of transistor 12 which causes it to be switched briefly to the conductive state. Since Zener diodes 22, 24 immediately reblock following a decrease of voltage to an allowable value, a brief switching to the conductive state of transistor 12 does not interfere with the generation of the spark. It should also be noted that, since the voltage across primary winding 10 is to be decreased very rapidly, ignition transistor 12 is switched to a sufficiently conductive state upon breakdown of Zener diodes 22, 24 that the voltage across resistor 14 is sufficient to cause transistor 28 to switch to the conductive state. Therefore, in the absence of diode 50, the current flowing through Zener diodes, 22, 24 could flow through the collector-emitter circuit of transistor 28. The resultant decrease in base potential of transistor 12 would cause this transistor to switch to the blocked state thereby preventing proper operation of its clamping circuit. Transistor 12 would thus again be exposed to the dangerous overvoltages. However, in the presence of diode 50, no current can flow from Zener diodes 22, 24 through the emitter-collector circuit of transistor 28. The latter is thus protected from excessive currents and, also, unable to interfere with the proper operation of transistor 12.

The embodiment shown in FIG. 2 is similar to that in FIG. 1; however diode 50 has been omitted. Instead of diode 50 a transistor 52 is provided. Transistor 50 has a collector connected to the base of transistor 28 and also connected through a resistor 54 to battery $U_B$. The emitter of transistor 52 is connected to a reference potential. As indicated by an arrow, an inverted ignition signal, that is the signal applied at terminal 48' after inversion by an inverter, is applied to the base of transistor 52. The inverted ignition signal maintains blocking transistor 52 is the conductive state during the time ignition transistor 12 would normally be blocked. The base of transistor 28 is therefore substantially at the reference potential independent of the voltage across precision resistor 14 while the ignition signal is applied at terminal 48'. Transistor 28 remains blocked and no current can flow through its emitter-collector circuit even if an overvoltage appears across primary winding 10 of the ignition coil. The clamping circuit can thus maintain transistor 12 in the conductive state for the desired brief time interval. Since the ignition signal applied at terminal 48' is present in any case in the ignition system, the use of the complementary (inverted) ignition signal at terminal 52 presents no difficulties.

It will be noted that the protective circuits of the present invention are readily incorporated into the present day ignition systems and operate reliably to prevent damage to the ignition transistor and the auxiliary transistor of such systems.

Various changes and modifications may be made within the scope of the inventive concepts.

We claim:

1. In an ignition system having a source of DC voltage ($U_B$), an ignition coil having a primary winding (10) connected to said source of DC voltage, ignition control means (12) having an output circuit having a first output terminal connected to said primary winding, a second output terminal, and a control electrode for controlling current flow through said primary winding in accordance with a control signal applied to said control electrode, means (14) connected to said second output terminal of said ignition control means for furnishing a limit signal when the current through said primary winding exceeds a predetermined current, and auxiliary control means (28) having a control electrode connected to said limit signal furnishing means and an output circuit connected to said control electrode of said ignition control means for decreasing current flowing through said primary winding in response to said limit signal, a protective circuit for said ignition and auxiliary control means, said protective circuit comprising clamping circuit means (16-26) connected between said output circuit and said control electrode of said ignition control means and having at least one threshold element (22-24) adapted to switch from a blocked to a conductive state when the voltage across said primary winding exceeds a predetermined voltage for furnishing a control signal allowing a selected current flow through said primary winding in response to a voltage across said primary winding in response to a voltage across said primary winding exceeding said predetermined voltage, said clamping circuit means further comprising voltage divider means (16 18) having a first and second end terminal respectively connected to said first and second output terminal of said ignition control means and a voltage divider tap (20) connected to said at least one threshold element; and means (50, 52) for blocking current flowing through said threshold element when said threshold element is in said conductive state from said output circuit of said auxiliary control means.

2. An ignition system as set forth in claim 1, wherein said ignition control means and said auxiliary control means each comprises a transistor, each of said transistors having an emitter-collector circuit constituting said output circuit and a base constituting said control electrode.

3. An ignition system as set forth in claim 2, wherein said limit signal furnishing means comprises a precision resistor.

4. An ignition system as set forth in claim 3, wherein said threshold element is a Zener diode.

5. An ignition system as set forth in claim 4, wherein said at least one threshold element is a series circuit comprising a first and second Zener diode.

6. An ignition system as set forth in claim 1, wherein said blocking circuit means comprises a diode (50) connected between said clamping circuit means and said output circuit of said auxiliary control element.

7. An ignition system as set forth in claim 1, wherein said ignition control means switches to a blocked state and is maintained in said blocked state for the duration of an externally applied ignition signal; and wherein said blocking circuit means comprises a blocking transistor maintained in the conductive state by said externally applied ignition signal and interconnected between said control electrode of said auxiliary control means and said source of DC voltage so that said auxiliary control means is maintained in the blocked state while said blocking transistor is in said conductive state.

8. An ignition system as set forth in claim 1, further comprising an additional resistor (26) connected between said control electrode and said second output terminal of said ignition control means.

* * * * *